(12) United States Patent
Mizutani et al.

(10) Patent No.: US 8,436,373 B2
(45) Date of Patent: *May 7, 2013

(54) LIGHT EMITTING DIODE WITH A LIGHT SOURCE SUITABLE STRUCTURE

(75) Inventors: Tomoya Mizutani, Hitachi (JP); Tsunehiro Unno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 108 days.

This patent is subject to a terminal disclaimer.

(21) Appl. No.: 13/217,860

(22) Filed: Aug. 25, 2011

(65) Prior Publication Data

US 2012/0126259 A1 May 24, 2012

(30) Foreign Application Priority Data

Nov. 24, 2010 (JP) ................................. 2010-260872

(51) Int. Cl.
*H01L 29/18* (2006.01)
*H01L 33/00* (2010.01)

(52) U.S. Cl.
USPC .................. 257/88; 257/98; 257/99; 257/100

(58) Field of Classification Search ........................ None
See application file for complete search history.

(56) References Cited

U.S. PATENT DOCUMENTS

| 7,663,138 | B2 | 2/2010 | Fujikura | |
|---|---|---|---|---|
| 2005/0253161 | A1* | 11/2005 | Horio et al. | 257/100 |
| 2007/0262293 | A1 | 11/2007 | Fujikura | |
| 2010/0148202 | A1* | 6/2010 | Tomoda | 257/98 |

FOREIGN PATENT DOCUMENTS

| JP | 2007305851 A | 11/2007 |
|---|---|---|
| JP | 2008078225 A | 4/2008 |

* cited by examiner

*Primary Examiner* — Wensing Kuo
*Assistant Examiner* — Moazzam Hossain
(74) *Attorney, Agent, or Firm* — Marty Fleit; Paul D. Bianco; Fleit Gibbons Gutman Bongini Bianco PL (57) ABSTRACT

A light emitting diode, comprising: a transparent substrate; a wiring layer; and a semiconductor light emitting element structure part between the transparent substrate and the wiring layer, the semiconductor light emitting element structure part further comprising: a semiconductor light emitting layer; a transparent conductive layer provided on the wiring layer side of the semiconductor light emitting layer; a transparent insulating film; a metal reflection layer; and a first electrode part and a second electrode part provided on the wiring layer side of the transparent insulating film, to be electrically connected to the wiring layer, wherein the first electrode part is electrically connected to the first semiconductor layer via a first contact part which is provided to pass through the transparent insulating film, and the second electrode part is electrically connected to the second semiconductor layer by a second contact part provided to pass through the transparent insulating film, the transparent conductive layer, the first semiconductor layer, and the active layer.

8 Claims, 9 Drawing Sheets

LIGHT EMITTING DIODE WITH A LIGHT SOURCE SUITABLE STRUCTURE

The present application is based on Japanese Patent Application No. 2010-260872 filed on Nov. 24, 2010, the entire contents of which are hereby incorporated by reference.

BACKGROUND OF THE INVENTION

1. Field of the Invention

The present invention relates to a light emitting diode, and particularly relates to a light emitting diode with a structure suitable for a light source for illumination.

2. Description of the Related Art

In recent years, light emitting diodes (LEDs hereafter), being semiconductor light emitting elements, realize high electric and optical conversion efficiency owing to an improvement of a crystal quality. Further, GaN-based and AlGaInP-based high quality crystal can be grown by MOVPE (Metal-Organic Vapor Phase Epitaxy), and therefore high luminance LEDs of blue, green, orange, yellow, and red colors can be manufactured (for example, see patent document 1). Thus, owing to an improvement of the crystal quality, emission efficiency of LEDs are increased and an influence of heat generation is reduced, and use of the light emitting diode in a large current is realized. Therefore, there is a wider application of the light emitting diode to a light source for illumination which requires a high luminance compared with LED for display.

Figure 10:
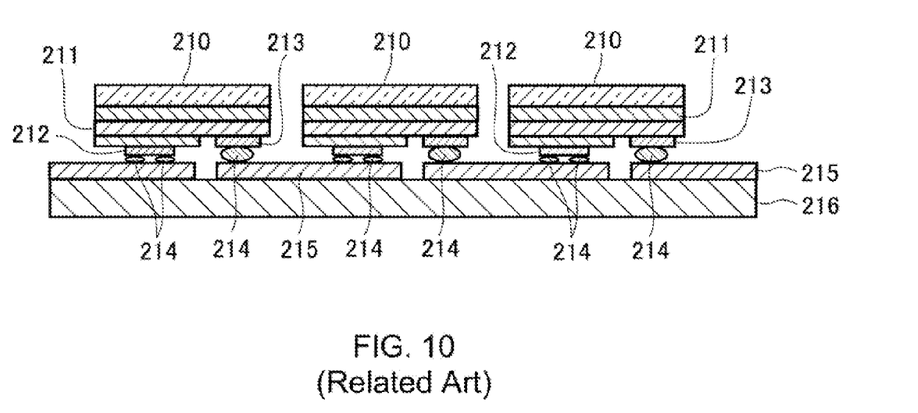
FIG. 10 is a sectional view showing a conventional light emitting diode.

In order to realize a higher output of a light emitting element, a larger-sized element is required and a resistance to a larger power is required. As an effective structure for such higher output and higher efficiency of LED, a flip chip structure using bumps is known (for example, see patent documents 1 and 2). In the flip chip structure, LED chips are used, wherein as shown in FIG. 10, a prescribed semiconductor layer 211 having a light emitting part is grown on a transparent substrate 210 by lamination, with two electrodes 212, 213 formed on the semiconductor layer 211 for current injection, and bumps 214 are formed on the electrodes 212 and 213 respectively. The LED chips with such a flip chip structure are mounted on a metal wiring 215 on the substrate 216 via the bumps 214. In the LED with the flip chip structure, the transparent substrate 210 side is used as a light extraction surface, and a light from the light emitting part is not shielded by electrodes. Therefore, high light extraction efficiency can be realized. Therefore, high light extraction efficiency can be realized.

[Patent Document 1]
Japanese Patent Laid Open Publication No. 2007-305851
[Patent Document 2]
Japanese Patent Laid Open Publication No. 2008-78225

In a structure disclosed in patent document 1, although reliable mounting by wire bonding is enabled, wire bonding needs to be applied to a light emitting element one by one. Therefore, such a structure is unsuitable for mounting a plurality of light emitting elements. Further, there is a problem that light emitted from a semiconductor light emitting part is shielded by bonding wire.

In a flip chip mounting using bumps as disclosed in patent document 2, a plurality of bumps need to be formed for mounting one LED, and therefore there is a problem that it is not easy to control quantity and height of each bump and not easy to perform positioning and bonding for LED mounting, thus easily generating a bonding failure, and making it difficult to improve productivity and yield rate.

BRIEF SUMMARY OF THE INVENTION

Therefore, it is desired to provide a light emitting diode with excellent heat radiation property and light emission property, and capable of realizing high productivity and yield rate.

According to a first aspect of the present invention, there is provided a light emitting diode, comprising:
a transparent substrate;
a wiring layer; and
a semiconductor light emitting element structure part between the transparent substrate and the wiring layer,
the semiconductor light emitting element structure part further comprising:
a semiconductor light emitting layer including a first semiconductor layer, an active layer, and a second semiconductor layer,
a transparent conductive layer provided on the wiring layer side of the semiconductor light emitting layer;
a transparent insulating film provided on the wiring layer side of the transparent conductive layer;
a metal reflection layer provided so as to be covered with the transparent conductive layer and the transparent insulating film; and
a first electrode part and a second electrode part provided on the wiring layer side of the transparent insulating film with an isolating region interposed between them, to be electrically connected to the wiring layer,
wherein the first electrode part is electrically connected to the first semiconductor layer via a first contact part which is provided to pass through the transparent insulating film, and the second electrode part is electrically connected to the second semiconductor layer by a second contact part provided to pass through the transparent insulating film, and is provided to pass through the transparent conductive layer, the first semiconductor layer, and the active layer, while being insulated therefrom.

DETAILED DESCRIPTION OF THE INVENTION

A light emitting diode according to an embodiment of the present invention will be described by using the drawings.
(First Embodiment)

Figure 1:
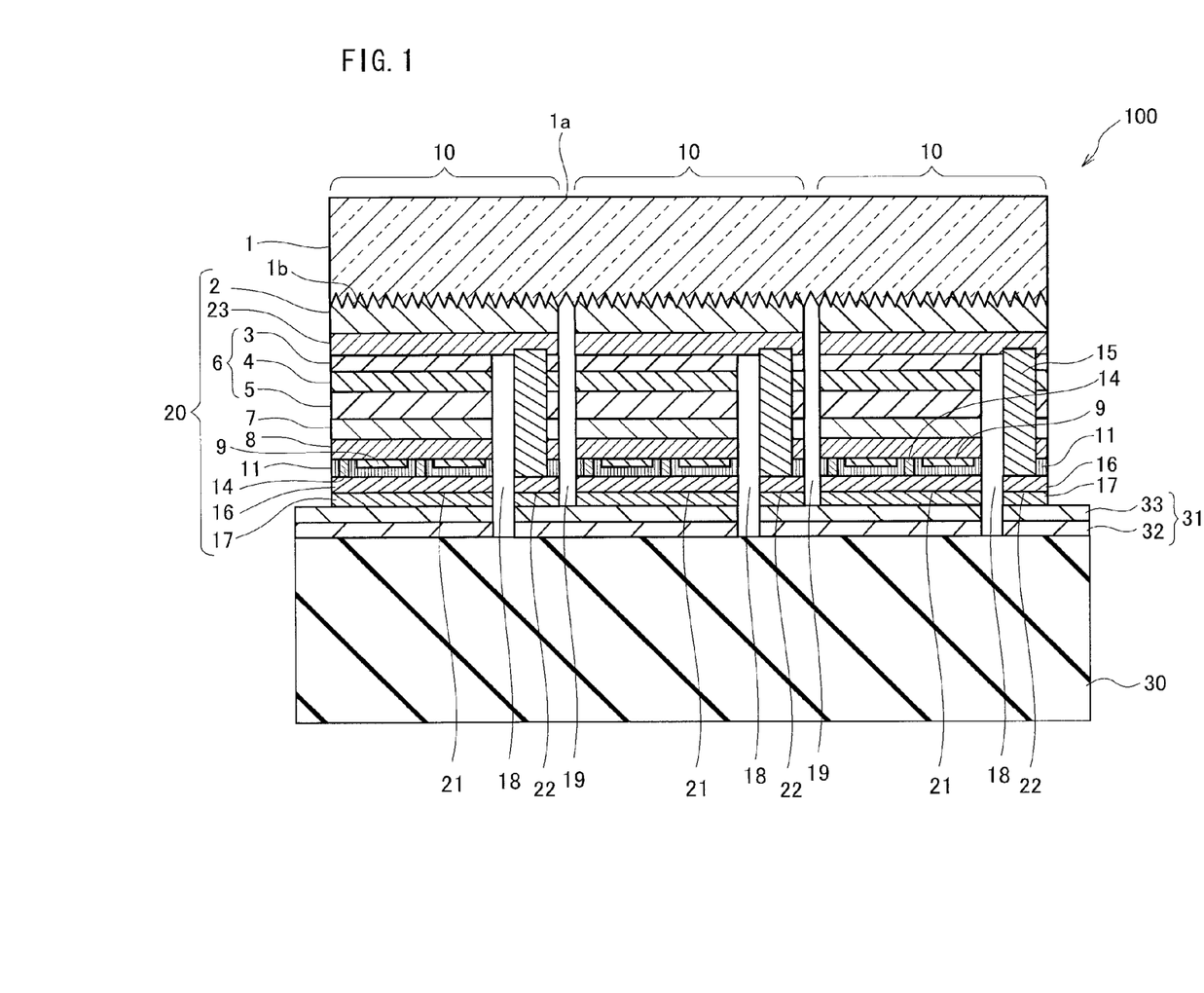
FIG. 1 is a sectional view showing a light emitting diode according to an embodiment of the present invention.

FIG. 1 shows the light emitting diode according to a first embodiment of the present invention.

A light emitting diode 100 of this embodiment has a transparent substrate 1; a supporting base 30; a wiring layer 31 arranged on the supporting base 30; and a semiconductor light emitting element structure part 20 provided between the transparent substrate 1 and the wiring layer 31.

The semiconductor light emitting element structure part 20 includes a semiconductor light emitting layer 6 having a first semiconductor layer 5, an active layer 4, and a second semiconductor layer 3; a transparent conductive layer 8 provided on the wiring layer 31 side of the semiconductor light emitting layer 6; a transparent insulating film 11 provided on the wiring layer 31 side of the transparent conductive layer 8; a metal reflection layer 9 provided so as to be covered with the transparent conductive layer 8 and the transparent insulating film 11; and a first electrode part 21 and a second electrode part 22 provided on the wiring layer 31 side of the transparent insulating film 11 with isolating regions (grooves) 18 and 19 interposed between them, and is electrically connected to the wiring layer 31. Elements of the semiconductor light emitting element structure part 20 are separated by the isolating region 19, and a plurality of semiconductor light emitting elements 10 are formed on the supporting base 30.

The first electrode part 21 and the second electrode part 22 include a bonding layer 17 on the supporting base 30 side, so that the first electrode part 21 and the second electrode part 22 are bonded to the wiring layer 31 by the bonding layer 17. The first electrode part 21 is electrically connected to the first semiconductor layer by the transparent conductive layer 8 and a first contact part 14 which is provided to pass through the transparent insulating film 11. The second electrode part 22 is electrically connected to the second semiconductor layer 3 by a second contact part 15 which is provided to pass through the transparent insulating film 11 and is provided to pass through the transparent conductive layer 8, the first semiconductor layer 5, and the active layer 4 while being insulated therefrom.

In this embodiment, the first electrode part 21 and the second electrode part 22 are constituted of a metal layer on which an adhesive layer 16 and the bonding layer (bonding metal layer) 17 are stacked from the transparent insulating film 11 side. The adhesive layer 16 is provided for the purpose of increasing adhesive property to the transparent insulating film 11. When $SiO_2$ is used as the transparent insulating film 11 for example, the adhesive layer 16 is provided in a thickness of about 2 nm to 20 nm, by using Ti (titanium), Ni (nickel), and Al (aluminum), etc., as a material of the adhesive layer 16. Further, the wiring layer 31 is formed of the metal layer on which an adhesive layer 32 and a bonding layer (bonding metal layer) 33 are stacked from the supporting base 30 side. As materials of the bonding layer 17 on the light emitting element side and the bonding layer 33 on the supporting base 30 side, for example, an Au-based material such as Au and Au eutectic alloy is used.

The bonding layer 17 of the first electrode part 21 and the second electrode part 22, and the bonding layer 33 of the wiring layer 31 are, for example, bonded to each other by thermal compression bonding or eutectic bonding. Surfaces of the bonding layer 17 of the first electrode part 21 and the second electrode part 22 (laminating surfaces, bonding surfaces) are approximately a coplanar state, and similarly surfaces of the bonding layer 33 of the wiring layer 31 (laminating surface, bonding surface) are in a coplanar state. Therefore, the bonding layer 17 and the bonding layer 33 are set in a planar bonding state (plane bonding) by thermal compression, etc. Therefore, bonding is ensured and facilitated, and a bonding failure can be prevented from occurring, compared with flip chip mounting using bumps (see FIG. 10).

The metal reflection layer 9 is a layer for reflecting a light emitted from the active layer 4 to the transparent insulating film 11 side, toward the semiconductor light emitting layer 6, and improving light extraction efficiency. As a material of the metal reflection layer 9, a metal such as Ag, Au, Cu, Al, or an alloy containing at least one of these metals, is used. The metal reflection layer 9 is preferably made of Ag. In this embodiment, the metal reflection layer 9 is provided so as to be covered with the transparent insulating film 11 and the transparent conductive layer 8. The metal reflection layer 9 is covered with the transparent insulating film 11, for the purpose of suppressing electromigration of the material (such as Ag) that constitutes the metal reflection layer 9.

The transparent substrate 1 is a substrate transparent to an emission wavelength. In the transparent substrate 1 of this embodiment, as shown in FIG. 1, a surface (main surface) on the semiconductor light emitting layer 6 side of the transparent substrate is not a flat surface but a surface having a concave-convex part 1b (texture structure, roughened surface structure). The concave-convex part 1b on the surface of the transparent substrate 1 is formed for improving light extraction efficiency. Further, the transparent substrate 1 of this embodiment is a substrate for growth, so that a semiconductor layer including the semiconductor light emitting layer 6 is grown thereon, wherein for example when the semiconductor layer including the semiconductor light emitting layer 6 is a group-III nitride semiconductor such as GaN, a sapphire substrate is preferably used as the transparent substrate 1. As the transparent substrate 1, for example, a GaN freestanding substrate may be used, other than the sapphire substrate.

In this embodiment, the semiconductor layer including the semiconductor light emitting layer 6 is provided without forming a gap between the semiconductor layer and a surface on which the concave-convex part 1b of the transparent substrate 1 is formed. In an example shown in FIG. 1, a buffer layer 2 is formed without forming the gap on the surface having the concave-convex part 1b of the transparent substrate 1. A growth condition is suitably set corresponding to the structure and the shape of the concave-convex part 1b, so that the semiconductor layer is grown on the surface (growth surface) having the concave-convex part 1b of the transparent substrate 1 without forming the gap.

Note that a light extraction surface 1a is formed on the surface (main surface) on the opposite side of the semiconductor light emitting layer 6 of the transparent substrate 1. A concave-convex part (texture structure) may also be formed on the light extraction surface 1a, to thereby further improve the light extraction efficiency.

The semiconductor layer including the semiconductor light emitting layer 6 of this embodiment, has a contact layer 7 provided on the transparent conductive layer 8 side of the first semiconductor layer 5, and a current dispersion layer 23 and a buffer layer 7 provided on the transparent substrate 1 side of the second semiconductor layer 3, other than the semiconductor light emitting layer 6.

Figure 2:
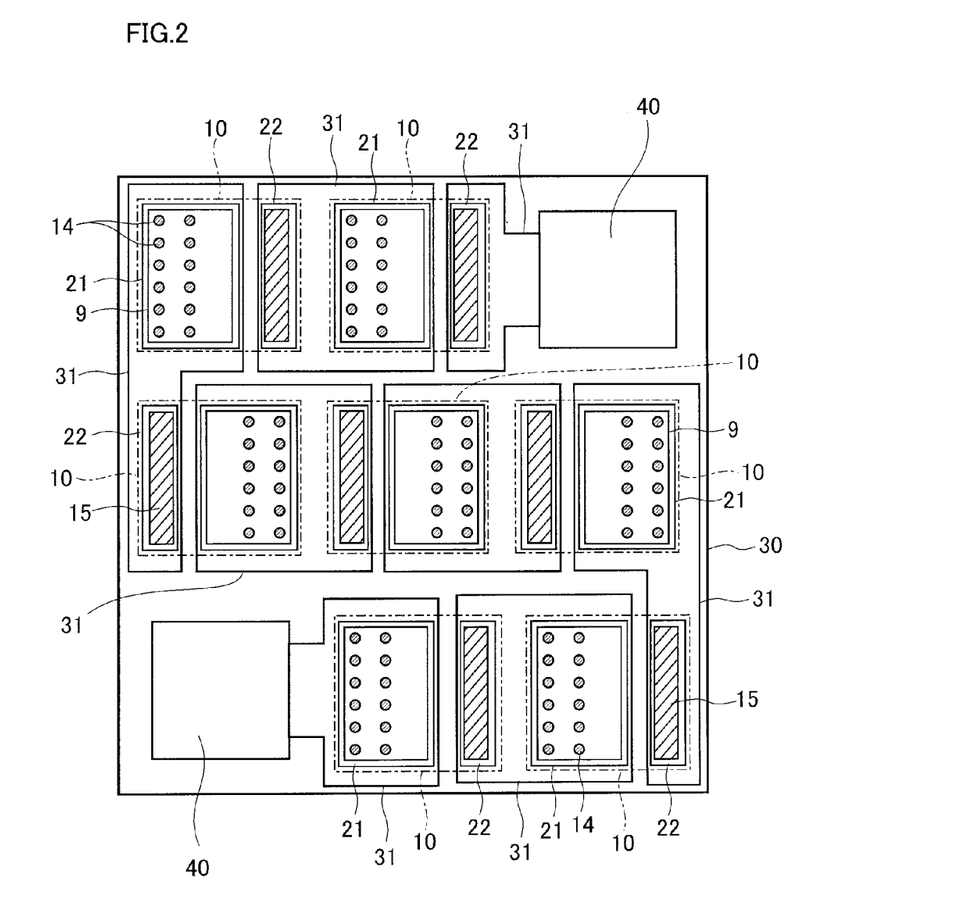
FIG. 2 is a view showing a connecting relation of a plurality of semiconductor light emitting elements in the light emitting diode of an embodiment of the present invention.

In this embodiment, as shown in FIG. 2, the wiring layer 31 arranged on the supporting base 30 is formed in a pattern in which a plurality of semiconductor light emitting elements 10 are connected in series. Namely, as shown in FIG. 2, pad electrodes 40 are formed on two wiring layers 31 which are arranged diagonally on a rectangular supporting base 30, and voltage is added between two pad electrodes 40 and 40, to thereby allow current to flow to seven semiconductor light emitting elements 10 which are connected in series in S-shape, via the wiring layer 31. Specifically, the current supplied from the wiring layer 31 which is connected to the first electrode part 21 of each semiconductor light emitting element 10, flows to the transparent conductive layer 8 through the first electrode part 21 and the first contact part 14, which is then diffused on the transparent conductive layer 8 and is supplied to the contact layer 7, and further flows through the first semiconductor layer 5, the active layer 4, the second semiconductor layer 3, and the buffer layer 2, and flows to the second electrode part 22 through the second contact part 15, and flows to the first electrode part 21 of semiconductor light emitting element 10 which is adjacent to the semiconductor light emitting element 10 and which is connected in series by the wiring layer 31 from the second electrode part 22 through the wiring layer 31.

Note that as shown in FIG. 2, first contact parts 14 are formed into dot shapes and second contact parts 15 are formed into rectangular shapes. However, they may be formed into ring shapes or branch shapes continuously. Further, by suitably changing the pattern of the wiring layer 31 on the supporting base 30 and an electrode part structure of the semiconductor light emitting element 10, a plurality of semiconductor light emitting elements 10 may be formed not only in a serial connection but also in a parallel connection or in a connection of a combination of the serial connection and the parallel connection.

According to the light emitting diode 100 of this embodiment, the first electrode part 21 and the second electrode part 22 on the opposite side of the transparent substrate 1 of the semiconductor structure part 20 are bonded to the wiring layer 31 on the supporting base 30. Therefore, there is no electrode, being a shielding object on the light extraction surface 2a side, and the light to the supporting base 30 is reflected toward the light extraction surface 2a by the metal reflection layer 9, and therefore high light extraction efficiency can be obtained.

Further, with a structure of a planar bonding between the first electrode part 21, the second electrode part 22, and the wiring layer 31, a bonding failure can be prevented from occurring even in a case of the light emitting diode 100 having a plurality of semiconductor light emitting elements 10, and emission irregularity of the light emitting diode can be suppressed. Then, not only suppression of the bonding failure but also facilitation of the bonding can be achieved, thus making it possible to realize improvement of productivity and yield rate of the light emitting diode.

Further, a heat radiation area can be taken large owing to the planar bonding between the first electrode part 21, the second electrode part 22, and the wiring layer 31, and a heat generated in the semiconductor light emitting element 10 can be efficiently escaped to the supporting base 30 side from the first electrode part 21 and the second electrode part 22 via the wiring layer 31, thus improving reliability of the light emitting diode. Further, by providing a plurality of semiconductor light emitting elements 10 in series, a current value and luminance can be easily adjusted.

Further, the semiconductor layer including the semiconductor light emitting layer 6 has a structure of being supported by the transparent substrate 1, and therefore the light emitting diode 100 can be easily handled, and the semiconductor layer can be protected. Further, the semiconductor layer including the semiconductor light emitting layer 6 is formed on the surface having the concave-convex part on the surface of the transparent substrate 1, and therefore the ratio of the light emitted from the semiconductor light emitting layer 6 and reflected by an interface surface between the transparent substrate 1 and the semiconductor layer and returned to the semiconductor light emitting layer 6 side, can be reduced, and high light extraction efficiency and emission efficiency of the light emitting diode can be maintained. Further, the transparent substrate 1, being the substrate for growth of the semiconductor layer including the semiconductor light emitting layer 6 is remained as it is and is used for the light emitting diode 100, and therefore a removing step of the transparent substrate 1 can be eliminated and a manufacturing step can be simplified.

Further, the transparent conductive layer 8 that functions as the current dispersion layer, on the wiring layer 31 side of the semiconductor layer including the semiconductor light emitting layer 6, and therefore emission irregularity of the light emitting diode can be suppressed.

[A Manufacturing Method of a First Embodiment]

A manufacturing step of the light emitting diode according to the first embodiment will be described hereafter, and a structure of the light emitting diode according to the first embodiment will be described in further detail. FIG. 3A to FIG. 5B respectively show an example of the manufacturing step of manufacturing the light emitting diode 100 according to this embodiment.

(The Step of Forming the Wiring Layer on a Supporting Base)

Regarding the supporting base (support substrate) 30, transparency to light is not required. For example, a single crystal substrate made of sapphire, Si, GaN, AlN, ZnO, SiC, BN, ZnS, and ceramics made of $Al_2O_3$, AlN, BN, MgO, ZnO, SiC, and C, etc., and a substrate made of a mixture of them, can be used. Particularly, among such materials, the supporting base 30 is preferably made of a material with high resistance and high heat conductivity.

Figure 3A:
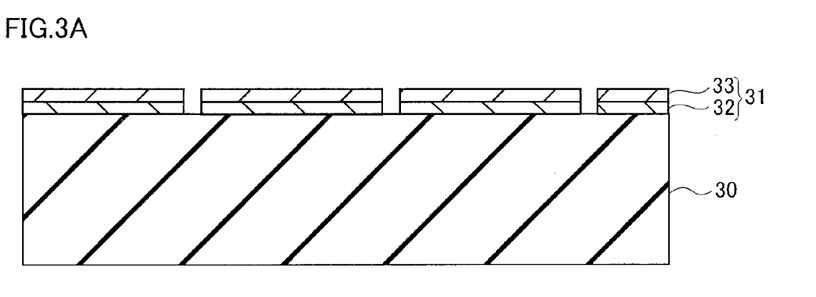
FIG. 3A is a sectional view showing a manufacturing step of manufacturing the light emitting diode according to an embodiment of the present invention.

As shown in FIG. 3A, it is desired to form a wiring pattern on the supporting base 30, so that an adhesive layer 32 and a bonding layer 33 are sequentially formed on the supporting base 30, and a wiring pattern is formed by photolithography and etching. The adhesive layer 32 is preferably made of Ti or Pt in a thickness of 1 nm or more and 20 nm or less. The bonding layer 33 is preferably made of Au or Au eutectic alloy in a thickness of 0.5 μm to 2.0 μm.

(The Step of Forming an Epitaxial Layer on the Substrate for Growth)

Figure 3B:
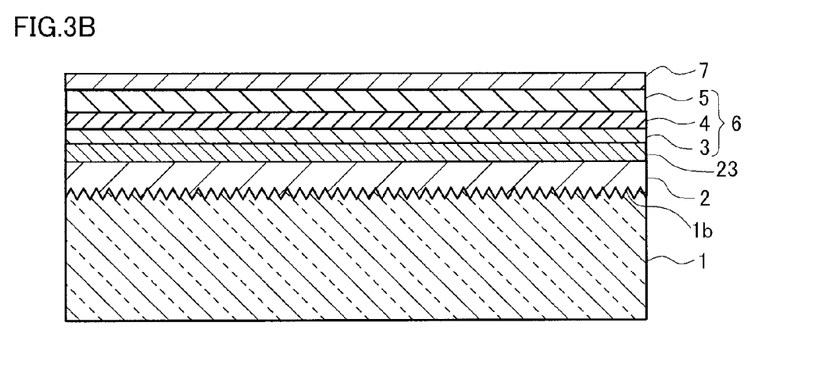
FIG. 3B is a sectional view showing a manufacturing step of manufacturing the light emitting diode according to an embodiment of the present invention.

In this embodiment, as shown in FIG. 3B, the concave-convex part 1b is previously formed on the surface on which the semiconductor layer is grown, on the sapphire substrate 1, being the transparent substrate, for improving the light extraction efficiency. The concave-convex part 1b is roughened by forming a minute concave-convex shape such as a cylindrical shape, a semi-spherical shape, a conical shape, and a rectangular shape, by etching with a prescribed cycle.

A group III-V compound semiconductor layers are formed by lamination on the surface (growth surface) having the concave-convex part 1b of the sapphire substrate 1, as a light emitting epitaxial layer. When nitride semiconductor epitaxial layers are formed, for example, the sapphire substrate 1 is prepared, and on the sapphire substrate 1, the nitride semiconductor epitaxial layers are formed by a HVPE (Hydride Vapor Phase Epitaxy) method and a MOVPE (Metal-Organic Vapor Phase Epitaxy) method, etc.

In this embodiment, the buffer layer 2 is formed without forming the gap on the surface having the concave-convex part 1b of the sapphire substrate 1. In order to grow the semiconductor layer without forming the gap on the surface (growth surface) having the concave-convex part 1b of the substrate 1, the growth condition is suitably set corresponding to the structure and the shape of the concave-convex part 1b. Specifically, the semiconductor layer is grown, so as to form a flat semiconductor crystal surface, by connecting a crystal grown in a lateral direction with a surface of a convex part of the concave-convex part 1b as a start point, and a crystal grown with a surface of a concave part of the concave-convex part 1b as a start point without forming the gap (a cavity part), to thereby form a flat semiconductor crystal surface.

In this embodiment, as an example of the semiconductor layer, an undoped GaN buffer layer 2, n-type GaN current dispersion layer 23, n-type AlGaN clad layer 3, being the second semiconductor layer, undoped quantum well type InGaN active layer (5 to 6 pairs of well layers and barrier layers) 4, p-type AlGaN clad layer 5, being the first semiconductor layer, and p-type GaN contact layer 7 are sequentially grown on the sapphire substrate 1, to thereby form an epitaxial wafer (FIG. 3B). As a specific example of the semiconductor layer, AlN mixed crystal ratio of each semiconductor layer, carrier concentration, and thickness, etc., are shown in table 1. The undoped GaN buffer layer 2 is provided for manufacturing the semiconductor light emitting layer 6 with suppressed dislocation (defect), and the n-type GaN current dispersion layer 23 is a layer with high carrier concentration for expanding the injected current to an entire body of the element.

Usually, the thickness of the sapphire substrate is, for example, about 400 μm, when the sapphire substrate has a diameter of 2 inches. The sapphire substrate is preferably made thin by a backlap process, after the step of forming the epitaxial layer in which the semiconductor layer is grown on the sapphire substrate, or after the bonding step. This is because time is required for making a thick sapphire substrate into chips by cutting it by a dicer because the sapphire substrate is hard, and therefore for example, the sapphire substrate having a thickness of about 400 μm is made thin to about 80 μm. Further, grooves are formed on the thinned sapphire substrate surface by a laser scriber, and thereafter the sapphire substrate is separated into each chips by breaking.

TABLE 1

| Name of semiconductor layer | AlN mix crystal ratio or well structure | Carrier concentration (cm$^{-3}$) | Thickness (μm) |
|---|---|---|---|
| P-type GaN contact layer 7 | 0.0 | 2 × 10$^{20}$ ※1 | 0.15 |
| P-type AlGaN clad layer 5 | 0.2 | 1 × 10$^{20}$ ※1 | 0.05 |
| Quantum well type InGaN active layer 4 | GaN/InGaN | Undope | 0.02/0.005 |
| n-type AlGaN clad layer 3 | 0.2 | 5 × 10$^{17}$ | 0.05 |
| n-type GaN current dispersion layer 23 | 0.0 | 1 × 10$^{18}$ | 5.0 |
| Undoped GaN buffer layer 2 | 0.0 | Undope | 8.0 |
| Sapphire substrate 1 | — | — | — |

※1: Not carrier concentration but Mg doping amount (The Step of Forming the Transparent Conductive Layer and the Metal Reflection Layer)

Figure 3C:
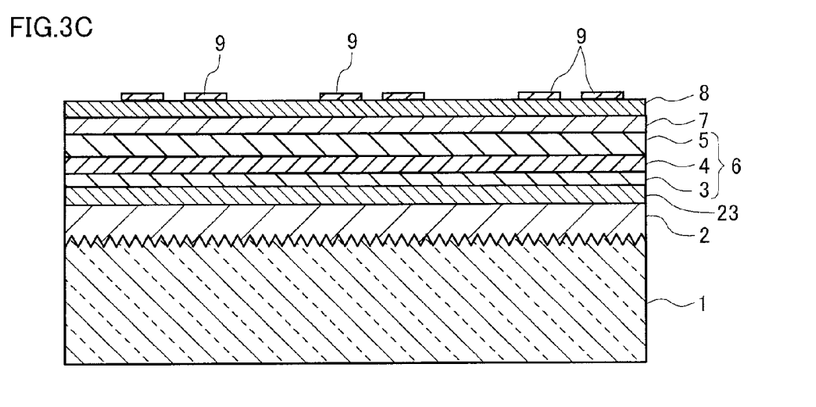
FIG. 3C is a sectional view showing a manufacturing step of manufacturing the light emitting diode according to an embodiment of the present invention.

Next, as shown in FIG. 3C, the transparent conductive layer 8 that functions as a current dispersion layer, is formed on the p-type GaN layer 7. ITO (indium tin oxide), etc., is used for the transparent conductive layer 8. Further, the metal reflection layer 9 is formed at a prescribed part of the transparent conductive layer 8. The metal reflection layer 9 is formed, for example, by forming Ag layer on an entire surface of the transparent conductive layer 8 by vapor deposition, and removing the Ag layer by etching at a part where the first contact part 14 and the second contact part 15 are formed. Note that in this embodiment, as shown in FIG. 2 and FIG. 4B, the metal reflection layer 9 is not formed on the side of the second contact part 15 but formed only on the first contact part 14 side.

(The Step of Forming the Transparent Insulating Film, the First Contact Part, and the Second Contact Part)

Figure 4A:
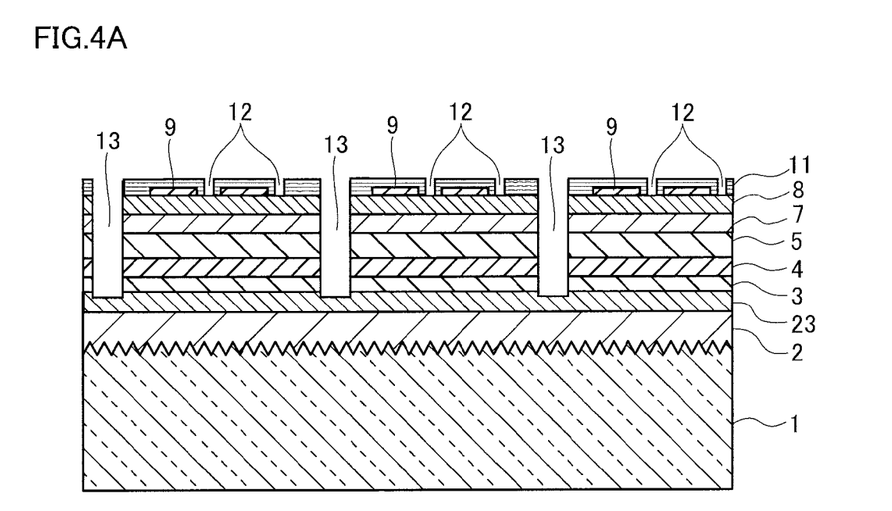
FIG. 4A is a sectional view showing a manufacturing step of manufacturing the light emitting diode according to an embodiment of the present invention.
Figure 4B:
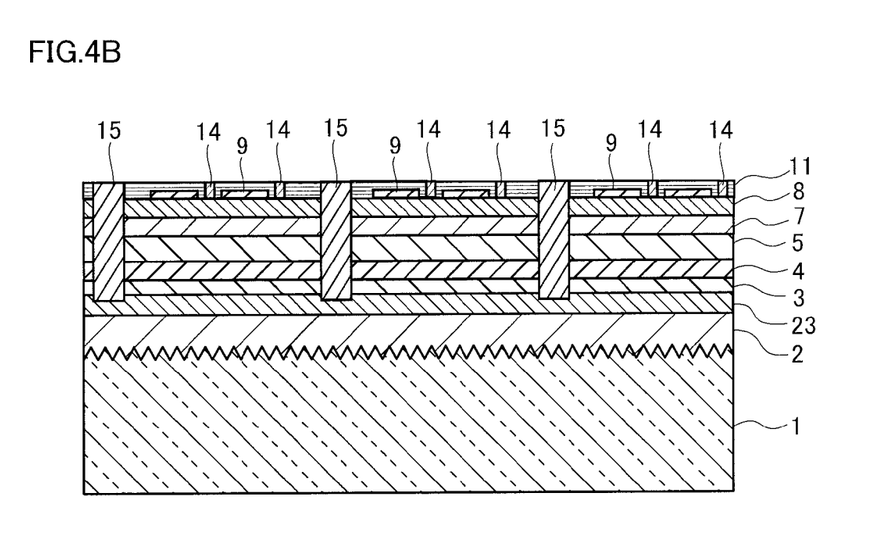
FIG. 4B is a sectional view showing a manufacturing step of manufacturing the light emitting diode according to an embodiment of the present invention.

Next, as shown in FIG. 4A, the transparent insulating film 11 is formed so as to cover the metal reflection layer 9 on the transparent conductive layer 8. For example, SiO$_2$ or SiN, etc., is used for the transparent insulating film 11. The metal reflection layer 9 is set in a state of being covered and enclosed by the transparent conductive layer 8 and the transparent insulating film 11. Subsequently, holes 12 are formed for forming p-type contact parts 14, being the first contact parts so as to pass through the transparent insulating film 11, by using photolithography and etching. Further, holes 13 are formed for forming n-type contact parts 15, being the second contact parts, so as to pass through the transparent insulating film 11, the transparent conductive layer 8, the p-type GaN layer 7, the p-type AlGaN clad layer 5, the InGaN active layer 4, and the n-type AlGaN clad layer 3, so as to extend to a part of the n-type GaN current dispersion layer 23.

At this time, an insulating film (such as SiO$_2$) not shown is provided on a side face of each hole 13 for the n-type contact part 15, for insulating from the transparent conductive layer 8, the p-type GaN layer 7, the p-type AlGaN clad layer 5, the InGaN active layer 4, and the n-type AlGaN clad layer 3. However, the hole 13 has a shallow (thin) depth (thickness of the epitaxial layer) of about 1 μm, while having a diameter of about 5 to 10 μm. Therefore, even if the insulating film is not formed, insulating property between the n-type contact part 15 and the transparent conductive layer 8, and the p-type GaN layer 7, etc., can be ensured by a gap not shown, by accurately forming the hole 13 and the n-type contact part 15.

Next, as shown in FIG. 4B, the p-type contact part 14 and the n-side contact part 15 are formed by providing Au-based metal into holes 12 and 13. For example, NiAu is used for the material of the p-type contact part 14 and the n-type contact part 15.

(The Step of Forming the First Electrode Part and the Second Electrode Part)

Figure 5A:
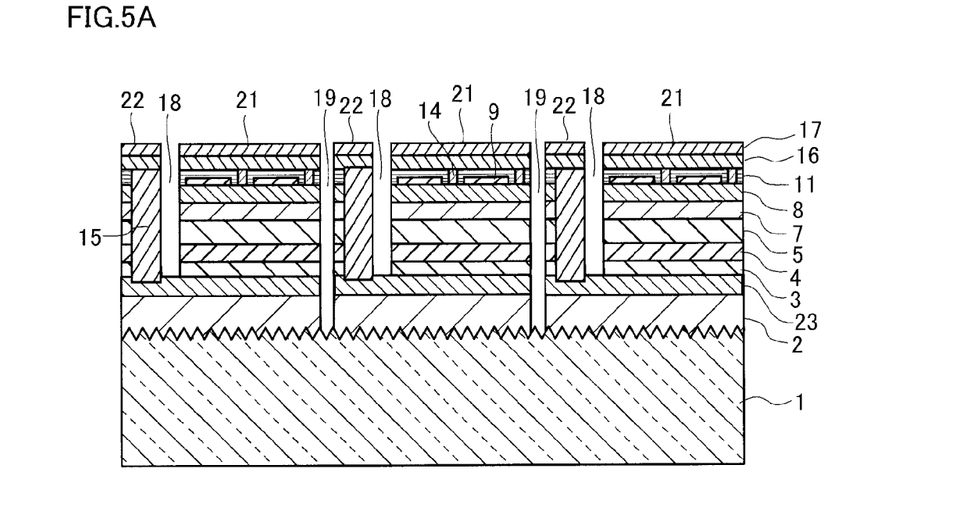
FIG. 5A is a sectional view showing a manufacturing step of manufacturing the light emitting diode according to an embodiment of the present invention.

Next, as shown in FIG. 5A, for example, the adhesive layer 16 made of Ti and the bonding metal layer 17 made of Au are formed by lamination on the transparent insulating film 11, the p-type contact part 14, and the n-type contact part 15 by vapor deposition, as an electrode layer for constituting the p-side electrode part 21, being the first electrode part, and the n-side electrode part 22, being the second electrode part.

Further, electrode separating grooves 18 and element separating grooves 19, being isolating regions, are formed over the adhesive layer 16, the bonding metal layer 17, the transparent insulating film 11, the transparent conductive layer 8, the p-type GaN layer 7, the p-type AlGaN clad layer 5, the InGaN active layer 4, and the n-type GaN clad layer 3, by using a photolithography method and an etching method, so that a region, being the p-side electrode part 21, and the transparent conductive layer 8 connected to the p-side electrode part 21 are not communicated with each other, and a region, being the n-side electrode part 22, and the transparent conductive layer 8 connected to the n-side electrode part 22 are not communicated with each other. The element separating groove 19 is further formed on the n-type GaN current dispersion layer 23 and the undoped GaN buffer layer 2, and the element separating groove 19 extends to the sapphire substrate 1. Thus, the p-side electrode part 21 and the n-side electrode part 22 are formed in such a manner as being separated from each other. The surface of the bonding metal layer 17 of the p-side electrode part 21 and the surface of the bonding metal layer 17 of the n-side electrode part 22 are the same heights.

When the element separating groove 19 is formed, a division groove (not shown) is provided to the semiconductor light emitting element structure part 20, so that the light emitting diode having a plurality of semiconductor light emitting elements 10 is cut out (divided) from one substrate. Further, when a pad electrode is formed, the semiconductor layer, etc., corresponding to the region for forming the pad electrode is removed by etching.

Note that an insulating matter such as $SiO_2$ may also be provided to the separating grooves 18 and 19. An electric insulating property between the p-side electrode part 21 side and the n-side electrode part 22 side is further ensured by providing the insulating matter to inside of the separating grooves 18 and 19.

Further, it is also acceptable that the side face of the semiconductor light emitting element 10 is protected to improve the light extraction efficiency, by forming the transparent insulating film (such as $SiO_2$) with low refractive index, on the side face of the semiconductor light emitting element 10.

(Bonding Step)

Figure 5B:
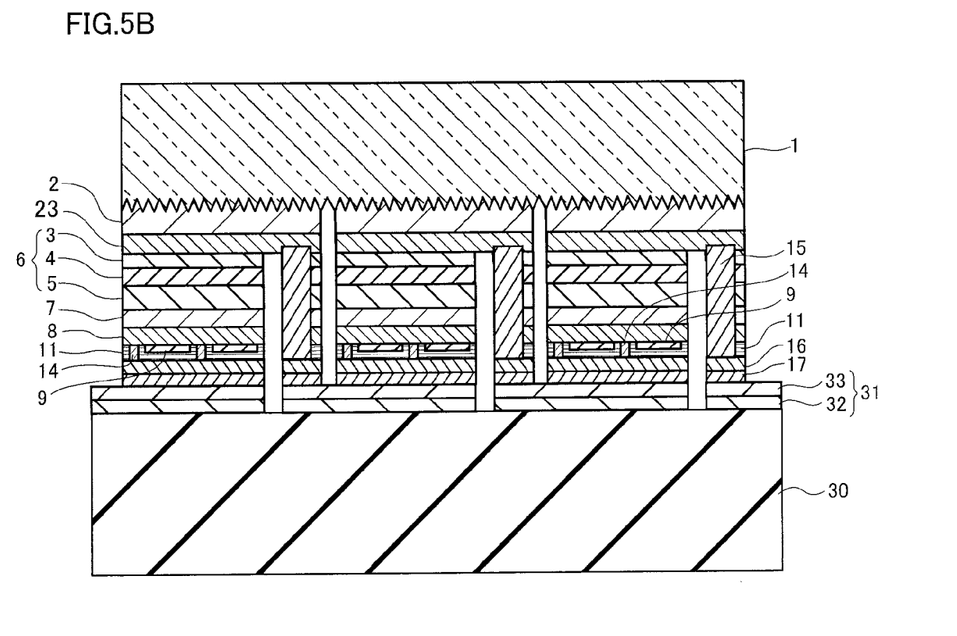
FIG. 5B is a sectional view showing a manufacturing step of manufacturing the light emitting diode according to an embodiment of the present invention.

The supporting base (support substrate) 30 with the wiring layer 31 shown in FIG. 3A formed thereon, and the epitaxial wafer with the semiconductor light emitting element 10 having the p-side electrode part 21 and the n-side electrode part 22 shown in FIG. 4C formed thereon, are bonded to each other as shown in FIG. 5B, to thereby manufacture a bonded wafer.

Specifically, positioning of the wiring layer 31, and the p-side electrode part 21, the n-side electrode part 22 is performed by using a bonding apparatus having a positioning function for a micro machine, and the bonding layer (the bonding metal layer) 33 of the wiring layer 31 and the bonding layer (the bonding metal layer) of the p-side electrode part 21 and the n-side electrode part 22 are brought into tight contact with each other, so as to be bonded to each other by thermocompression. Specifically, the supporting base 30 and the epitaxial wafer are respectively set in the bonding apparatus in a tight adhesion state by giving pressure thereto and by raising a temperature to 350° C., in a high vacuum state. Such a state is maintained for 1 hour, and thereafter the temperature is decreased to a room temperature and pressurization is canceled, to thereby obtain a bonded wafer. Note that bonding between the supporting base 30 and the epitaxial wafer may also be performed by eutectic bonding, other than bonding by thermocompression.

(Chipping Step by Dicing)

Next, the sapphire substrate 1 and the supporting base 30 are cut by a dicing blade, with a position of the division groove formed before lamination set as a cutting part, so as to be chipped into the light emitting diode with a prescribed size having a plurality of semiconductor light emitting elements 10. A width of the division groove having a sufficient margin (for example, 50 μm) is set, with respect to a width of the dicing blade (for example, 30 μm).

[Other Embodiment]

Figure 6A:
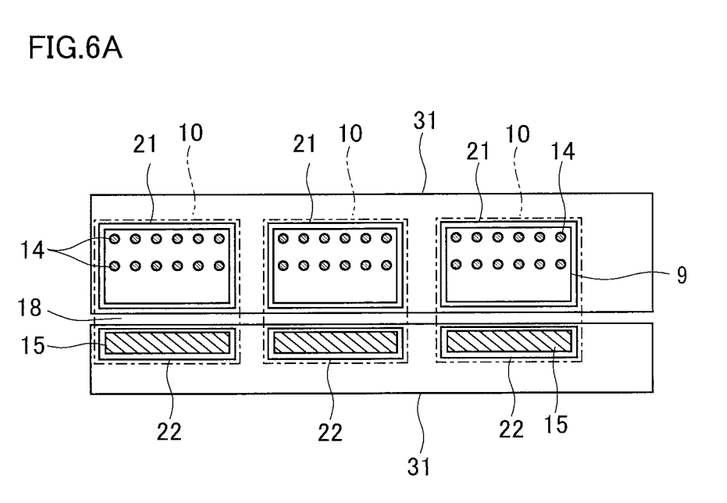
FIG. 6A is a view showing a connecting relation of a plurality of semiconductor light emitting elements in the light emitting diode according to other embodiment of the present invention.
Figure 6B:
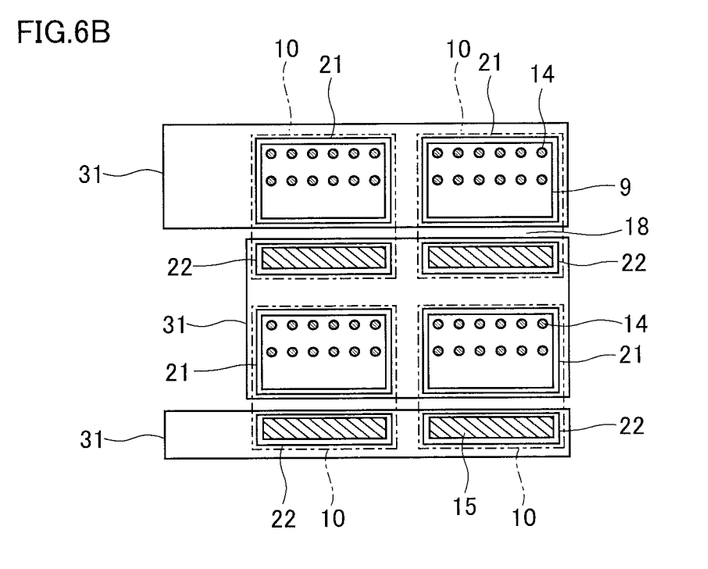
FIG. 6B is a view showing the connecting relation of a plurality of semiconductor light emitting elements in the light emitting diode according to other embodiment of the present invention.

According to the first embodiment, the light emitting diode 100 with a plurality of semiconductor light emitting elements 10 connected in series, has been described. However, the plurality of semiconductor light emitting elements 10 may be connected in parallel, or may be connected in combination of a serial connection and a parallel connection. FIG. 6A shows an example of an electrode part and a wiring layer structure, with three semiconductor light emitting elements 10 connected in parallel. Further, FIG. 6B shows an example of an electrode part and a wiring layer structure, with two semiconductor light emitting elements 10 at the right side connected in series, and two semiconductor light emitting elements at the left side connected in parallel.

Figure 7:
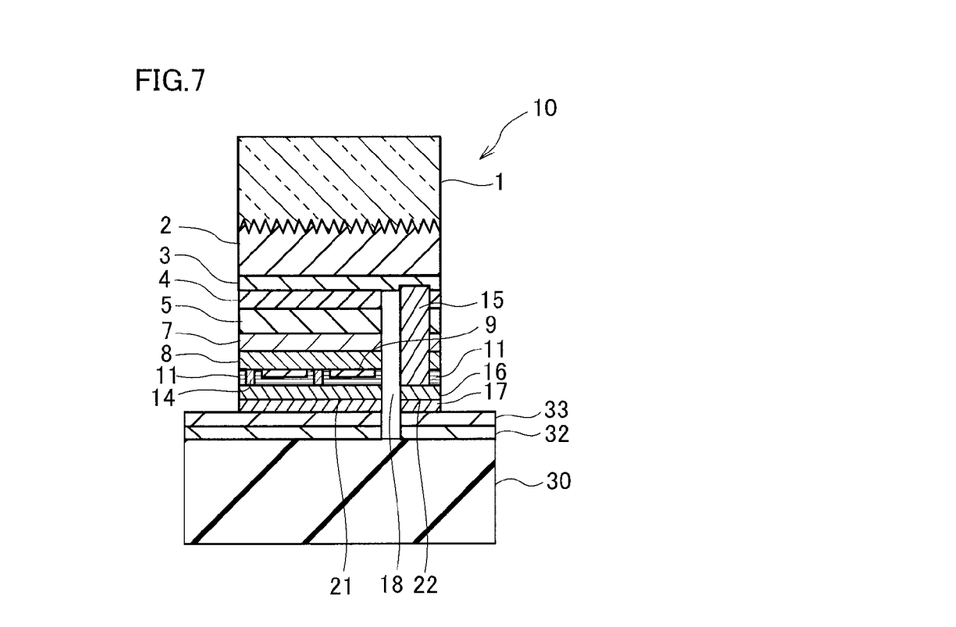
FIG. 7 is a sectional view showing the light emitting diode according to other embodiment of the present invention.

In this embodiment, the light emitting diode with a plurality of semiconductor light emitting elements 10 connected in series or in parallel, has been described. However, as shown in FIG. 7, the light emitting diode of the present invention may also be one element type light emitting diode with one semiconductor light emitting element 10 formed on the supporting base 30.

Figure 8:
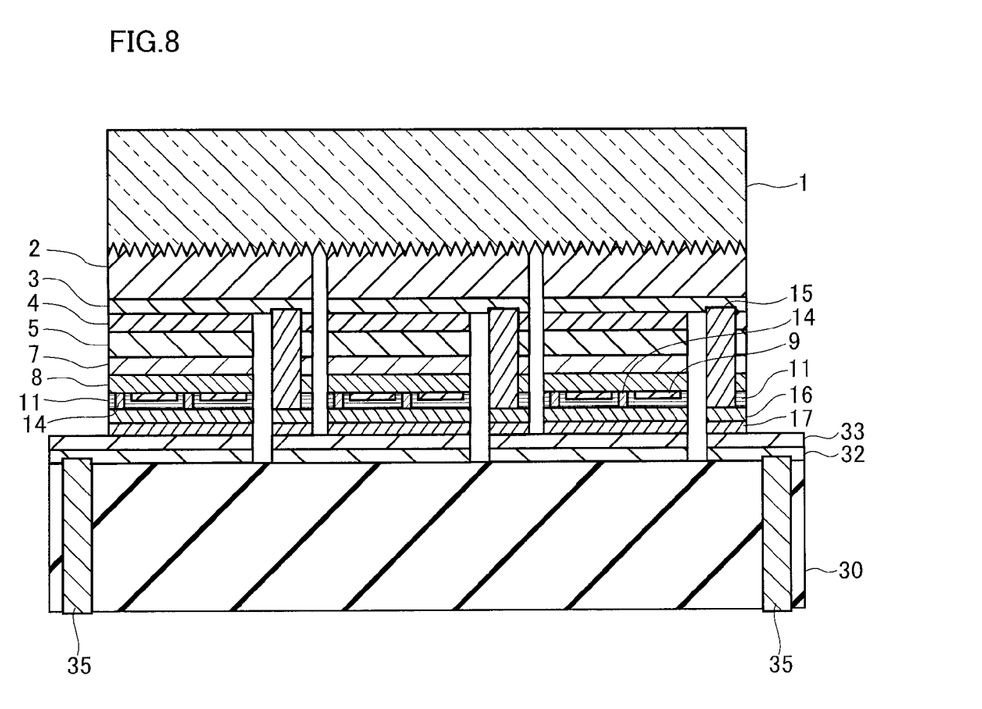
FIG. 8 is a sectional view showing the light emitting diode according other embodiment of the present invention.

Further, as shown in FIG. 8, a base contact part 35 electrically connected to the wiring layer 31 may be formed by forming the through hole on the supporting base 30 and filling it with a metal material. A pair or more of base contact parts 35 are provided to one light emitting diode. Out of the pair of base contact parts 35, one base contact part 35 is connected to the p-side electrode part and the other base contact part 35 is connected to the n-side electrode part, and further the substrate contact part 35 is connected to wiring of a stem, etc., (not shown) on a rear surface side of the supporting base 30, so that the current is supplied to the light emitting diode through the substrate contact part 35. By using the supporting base contact parts 35, there is no necessity for providing a region of the pad electrode on the wiring layer 31, and this contributes to miniaturization of the light emitting diode. Further, in a structure of having the base contact parts 35, wire bonding can be eliminated, and the structure and connection of the electrode part and wiring can be simplified, and a current amount can be easily increased.

Further, in this embodiment, a conductive type of n-type and p-type of the semiconductor light emitting layer 6, etc., may be inverted.

Further, in this embodiment, DC flows to one or a plurality of semiconductor light emitting elements 10 connected in series. However, the semiconductor light emitting element 10 may be driven by using a commercial AC power. When the commercial AC power is used, there is a problem such as being hard to see, due to blinking light of the light emitting element by flowing AC to the semiconductor light emitting element 10 as it is. In this case, for example, a frequency multiplication circuit may be provided on a supporting base 30 for increasing the frequency by twice or four times, or a bridge rectifier circuit may be provided for rectifying and smoothing the AC.

EXAMPLE

Next, examples of the present invention will be described.
The light emitting diode (LED) according to an example was manufactured based on the structure of the light emitting diode according to the aforementioned embodiment of the present invention.

Example 1

Figure 9:
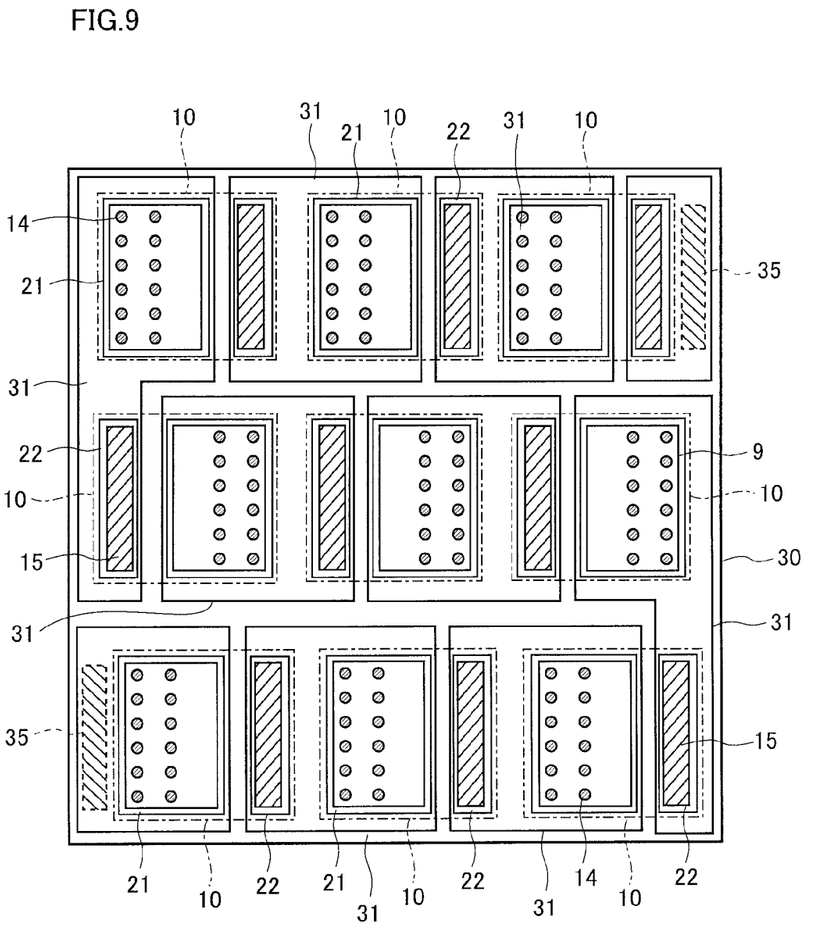
FIG. 9 is a view showing the connecting relation of a plurality of semiconductor light emitting elements in the light emitting diode of an example of the present invention.

As shown in FIG. 9, in the LED of an example 1, nine semiconductor light emitting elements 10 are arranged in a grid-point pattern on a rectangular supporting base 30. Further, in FIG. 9, the base contact parts 35 are provided in the vicinity of the semiconductor light emitting elements 10 in an upper right corner and in a lower left corner on the supporting base 30, and a voltage is applied between the two base contact parts 35 and 35, to allow the current to flow to the nine semiconductor light emitting elements 10 connected in series in S-shapes through the wiring layers 31.

The sapphire substrate was used for the transparent substrate 1, and a gallium nitride-based semiconductor shown in table 1 of the aforementioned embodiment was used for the epitaxial layer including the semiconductor light emitting layer 6 of the semiconductor light emitting element 10. ITO was used for the transparent conductive layer 8, Ag was used for the metal reflection layer 9, $SiO_2$ was used for the transparent insulating film 11, NiAu was used for the p-side contact part 14 and the n-side contact part 15, and Au was used for the bonding layers 17, 33, respectively.

C-face sapphire substrate was used as the sapphire substrate, and patterning (width:2 μm, cycle:4 μm, stripe orientation: stripe extending direction are <11-20☐ direction of the sapphire substrate) was performed to a photoresist provided on the c-face sapphire substrate, and thereafter sectional square-shaped etching was performed to a depth of 4 μm by RIE (Reactive Ion Etching) apparatus, to thereby form a stripe-shaped concave-convex part on the surface of the c-face sapphire substrate.

Subsequently, after the photoresist was removed, the sapphire substrate was mounted on the MOVPE apparatus, and a temperature was raised to 1100° C. in a hydrogen atmosphere, to thereby perform thermal etching. Thereafter, the temperature of the sapphire substrate was decreased to 500° C., and a GaN low temperature buffer layer was grown by flowing trimethyl gallium (TMG hereafter) as a Ga raw material, and flowing ammonia as an N raw material. Subsequently, the temperature of the substrate was raised, and the n-type GaN current dispersion layer was grown by flowing TMG and ammonia as Ga (gallium) raw material, and N (nitrogen) raw material, and flowing $SiH_4$ (silane) as a n-type dopant. Further, trimethyl aluminum was used as Al (aluminum) raw material, trimethyl indium was used as In (indium) raw material, and $Cp_2Mg$ (Bis cyclopentadienyl magnesium) was used as the n-type dopant, for growing a semiconductor layer above the n-type GaN current dispersion layer.

Further, regarding a size of each part, the size of the light emitting diode 100 was set to 1 mm square, the size of the semiconductor light emitting element 10 was set to 300 μm square, and an area of the metal reflection layer 9 was set to 260 μm×130 μm (the metal reflection layer 9 was formed only on the p-side electrode part 21 side). Further, 50 cylindrical electrodes in total with a diameter of 5 μm was arranged in the p-side contact part 14, and a sectional area of the n-side contact part 15 was set to 260 μm×20 μm.

The nitride LED of the example 1 was mounted on the stem, and the light emission and the electric property were measured. The voltage at the time of flowing the current 40 mA was 34.2V, which was a high value, compared with a normal blue LED. This is because nine semiconductor light emitting elements 10 are connected in series. Brightness at this time was 24 lumen, with a wavelength of 460 nm, and light emission efficiency was 17.51 m/W, which was an extremely high value as the blue LED. The reason why such a high value was obtained in a case of the blue LED, is that the light extraction efficiency is increased by having no electrode (shielding object) on the surface (light extraction surface), similarly to the LED of a conventional flip chip structure (see FIG. 10). However, such a high light extraction efficiency could not be obtained by the LED of the conventional flip chip structure. This is because a defect is generated in the active layer, by a bump connection during flip chip mounting. In this example, the wiring layer and the p-side electrode part, the n-side electrode part are bonded by metal planar bonding, and therefore wafer connection (lamination) can be made by adding uniform force to the active layer, thus making it possible to achieve a high internal quantum efficiency. Further, planar bonding with a wider surface is achieved by laminating, thus making it possible to achieve excellent heat radiation property and suppress rise of the temperature of the active layer by energization.

Conventionally, in order to obtain LED with high luminance, input power into the LED needs to be increased. The size of the conventional LED chip allows a current of 360 mA (40 mA×9) to flow. It is difficult to flow such a volume of current by thin wiring as mounting wiring, and thick wiring needs to be used. Further, a power transistor is required as a transistor for controlling the current, thus increasing the size of the element and accordingly incurring a high cost. Meanwhile, a transistor responding to a small current although having a high withstanding voltage suffices as the transistor used for driving the LED having the structure of this example. Therefore, mounting of nine semiconductor light emitting elements 10 can be performed easily by a single mounting, and also a circuit in a periphery of the LED can be miniaturized at a low cost. Particularly, in a switching drive, its effect can be exhibited at a maximum.

Further, current dispersion is carried out by the transparent conductive layer, and therefore the number of dot-shaped p-side contact parts can be reduced, and an arrangement position of the p-side contact parts can be formed at the end of each LED element (as an example of an arrangement relation, the p-side contact part, the metal reflection layer, and the n-side contact part are arranged in this order on a formation surface of the transparent insulating film). Thus, an area of the metal reflection layer can be taken wider, thus making it possible to achieve the improvement of the light extraction efficiency.

Comparative Example 1

LED with a structure of omitting the transparent conductive layer of the example 1 was manufactured. However, the current dispersion was not satisfactory and emission irregularity was observed. In order to eliminate the emission irregularity, it can be considered that the number of the p-side contact parts is increased. However, it was confirmed that if the number of the p-side contact parts was increased, the area of the metal reflection layer was narrower, and as a result, light extraction efficiency was reduced.

Example 2

Regarding the LED of the example 2, the LED was manufactured similarly to the example 1, other than a point that the sapphire substrate not having a concave-convex texture was used. Regarding the LED of the example 2, the emission property was measured similarly to the example 1. In the LED of the example 2 as well, there is no emission irregularity similarly to the example 1. However, the brightness was 15 lumen (1 m) with a wavelength of 460 nm. Such a value was 10.91 m/W in terms of emission efficiency, corresponding to the emission efficiency of about 60% of the example 1. In the example 2, the cause for the reduction of the emission efficiency is considered such that a part of the light from the semiconductor light emitting layer is not transmitted through the sapphire substrate but is reflected by the sapphire substrate, by an influence of a difference in refractive index between the GaN layer and the sapphire substrate. Accordingly, an uneven texture structure is preferably provided to the surface of the sapphire substrate.

Comparative Example 2

As comparative example 2, LED with the sapphire substrate removed and the GaN buffer layer 2 subjected to roughening process after the laminating step, was manufactured in the example 2. In the LED of the comparative example 2, an emission output equivalent to the emission output of the example 1 could be obtained. However, the step of removing the sapphire substrate, and the step of roughening the GaN buffer layer 2 are required, and therefore the example 1 is more preferable, from a viewpoint of productivity.

Other Example

When the sapphire substrate is used for the transparent substrate, AlN film of 1 to 20 nm may be formed on the sapphire substrate. The film thickness of the AlN film is preferably set to 2 to 10 nm.

Further, a surface modifying film may be formed on the surface of the sapphire substrate. For example, a nitride film is formed on the surface of the sapphire substrate as the surface modifying film, by applying plasma treatment and nitriding treatment to the surface of the sapphire substrate, in a nitrogen gas atmosphere. Specifically the nitriding treatment is carried out in such a manner that the temperature of the sapphire substrate is raised to 300° C. from a room temperature, then the plasma treatment is applied thereto in a gas atmosphere containing nitrogen gas or nitrogen, and thereafter the temperature is decreased to the room temperature. As an example, the nitrogen gas:30 sccm is introduced into an ECR plasma apparatus, thereby setting the atmosphere in a vacuum state of about 7 mTorr, and in this state, plasma is generated by microwave irradiation (power of 100 W), to thereby form the nitride film on the sapphire substrate. The thickness of the nitride film can be controlled by changing the temperature of plasma treatment and power. The thickness of the nitride film is formed in a range of 1 nm to 10 nm. Preferably, the thickness of the nitride film is set in a range of 2 to 6 nm. If the nitride film is excessively thick, crystallinity of the nitride film is deteriorated, and a dislocation density of the nitride semiconductor layer formed on the nitride film becomes large. Note that when the temperature of the sapphire substrate with the nitride film formed thereon is raised to a growth temperature, the nitride film is prevented from being etched. Therefore, the temperature is raised in an ammonia atmosphere.

What is claimed is:
1. A light emitting diode, comprising:
a transparent substrate;
a wiring layer; and
a semiconductor light emitting element structure part between the transparent substrate and the wiring layer, the semiconductor light emitting element structure part further comprising:
a semiconductor light emitting layer including a first semiconductor layer, an active layer, and a second semiconductor layer,
a transparent conductive layer provided on the wiring layer side of the semiconductor light emitting layer;
a transparent insulating film provided on the wiring layer side of the transparent conductive layer;
a metal reflection layer provided so as to be covered with the transparent conductive layer and the transparent insulating film; and
a first electrode part and a second electrode part provided on the wiring layer side of the transparent insulating film with an isolating region interposed between them, to be electrically connected to the wiring layer,
wherein the first electrode part is electrically connected to the first semiconductor layer via a first contact part which is provided to pass through the transparent insulating film, and the second electrode part is electrically connected to the second semiconductor layer by a second contact part provided to pass through the transparent insulating film, and is provided to pass through the transparent conductive layer, the first semiconductor layer, and the active layer, while being insulated therefrom.

2. The light emitting diode according to claim 1, wherein the transparent substrate has a concave-convex part on a surface of the semiconductor light emitting element structure part side, and a semiconductor layer including the semiconductor light emitting layer is provided without forming a gap with respect to the surface on which the concave-convex part of the transparent substrate is formed.

3. The light emitting diode according to claim 1, wherein a plurality of semiconductor light emitting elements are provided on the wiring layer, so that the plurality of semiconductor light emitting elements of the semiconductor light emitting element structure part are separated from each other.

4. The light emitting diode according to claim 3, wherein the plurality of semiconductor light emitting elements are provided on one continuous sheet of an insulating supporting base.

5. The light emitting diode according to claim 1, wherein the first electrode part and the second electrode part have a bonding layer, and are bonded to the wiring layer by the bonding layer.

6. The light emitting diode according to claim 1, wherein the wiring layer is provided on an insulating supporting base.

7. The light emitting diode according to claim 6, wherein through holes are formed at two places or more on the supporting base, and base contact parts which are electrically connected to the wiring layer, are formed by providing a metal material into the through holes.

8. A light emitting diode, comprising:
a transparent substrate;
a wiring layer; and a semiconductor light emitting element structure part between the transparent substrate and the wiring layer, the semiconductor light emitting element structure part further comprising:
a semiconductor light emitting layer including a first semiconductor layer, an active layer, and a second semiconductor layer,
a transparent conductive layer provided on the wiring layer side of the semiconductor light emitting layer;
a transparent insulating film provided on the wiring layer side of the transparent conductive layer; and
a first electrode part and a second electrode part provided on the wiring layer side of the transparent insulating film with an isolating region interposed between them, to be electrically connected to the wiring layer,
wherein the first electrode part is electrically connected to the first semiconductor layer via a first contact part which is provided to pass through the transparent insulating film, and the second electrode part is electrically connected to the second semiconductor layer by a second contact part provided to pass through the transparent insulating film, and is provided to pass through the transparent conductive layer, the first semiconductor layer, and the active layer, while being insulated therefrom.

* * * * *